(12) United States Patent
Bokma et al.

(10) Patent No.: US 7,804,307 B1
(45) Date of Patent: Sep. 28, 2010

(54) CAPACITANCE MEASUREMENT SYSTEMS AND METHODS

(75) Inventors: Louis Bokma, Newark, CA (US); Andrew Best, Stanford, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 78 days.

(21) Appl. No.: 11/823,982

(22) Filed: Jun. 29, 2007

(51) Int. Cl.
*G01R 27/26* (2006.01)

(52) U.S. Cl. .................. 324/663; 702/64; 702/117; 324/607; 324/678; 324/765

(58) Field of Classification Search .................. 324/663, 324/676–678
See application file for complete search history.

(56) References Cited

U.S. PATENT DOCUMENTS

| | | | |
|---|---|---|---|
| 4,039,940 A | 8/1977 | Eichelberger | |
| 4,145,748 A | 3/1979 | Eichelberger et al. | |
| 4,558,274 A * | 12/1985 | Carusillo | 324/607 |
| 4,614,937 A | 9/1986 | Poujois | |
| 4,728,932 A | 3/1988 | Atherton | |
| 4,825,147 A | 4/1989 | Cook et al. | |
| 4,831,325 A | 5/1989 | Watson, Jr. | |
| 5,374,787 A | 12/1994 | Miller et al. | |
| 5,461,321 A * | 10/1995 | Sanders et al. | 324/678 |
| 5,479,103 A * | 12/1995 | Kernahan et al. | 324/433 |
| 5,488,204 A | 1/1996 | Mead et al. | |
| 5,495,077 A | 2/1996 | Miller et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,648,642 A | 7/1997 | Miller et al. | |
| 5,730,165 A | 3/1998 | Philipp | |
| 5,760,852 A | 6/1998 | Wu et al. | |
| 5,801,340 A | 9/1998 | Peter | |
| 5,841,078 A | 11/1998 | Miller et al. | |
| 5,854,625 A | 12/1998 | Frisch et al. | |
| 5,861,583 A | 1/1999 | Schediwy et al. | |
| 5,880,411 A | 3/1999 | Gillespie et al. | |
| 5,889,236 A | 3/1999 | Gillespie et al. | |
| 5,914,465 A | 6/1999 | Allen et al. | |
| 5,920,309 A | 7/1999 | Bisset et al. | |
| 5,920,310 A | 7/1999 | Faggin et al. | |
| 5,942,733 A | 8/1999 | Allen et al. | |
| 6,028,271 A | 2/2000 | Gillespie et al. | |
| 6,188,391 B1 | 2/2001 | Seely et al. | |
| 6,191,723 B1 | 2/2001 | Lewis | |
| 6,353,200 B1 | 3/2002 | Schwankhart | |
| 6,380,931 B1 | 4/2002 | Gillespie et al. | |

(Continued)

OTHER PUBLICATIONS

USPTO Notice of Allowance for U.S. Appl. No. 11/230,719, filed Jan. 16, 2008; 4 pages.

(Continued)

*Primary Examiner*—Timothy J Dole
*Assistant Examiner*—Benjamin M Baldridge

(57) ABSTRACT

A first capacitor and a second capacitor are charged until voltage at the second capacitor settles to a settling voltage. While charging, the first capacitor is alternately switched between a current source and ground. When the settling voltage is reached, charging of the first capacitor is halted. The second capacitor continues to be charged until voltage at the second capacitor reaches a reference voltage. The amount of time it takes for the settling voltage to reach the reference voltage corresponds to a measure of capacitance on the first capacitor.

25 Claims, 5 Drawing Sheets

U.S. PATENT DOCUMENTS

| | | | |
|---|---|---|---|
| 6,414,671 B1 | 7/2002 | Gillespie et al. | |
| 6,448,911 B1 | 9/2002 | Somayajula | |
| 6,535,200 B2 | 3/2003 | Philipp | |
| 6,570,557 B1 | 5/2003 | Westerman et al. | |
| 6,583,632 B2 | 6/2003 | Von Basse et al. | |
| 6,610,936 B2 | 8/2003 | Gillespie et al. | |
| 6,667,740 B2 | 12/2003 | Ely et al. | |
| 6,677,932 B1 | 1/2004 | Westerman | |
| 6,750,852 B2 | 6/2004 | Gillespie et al. | |
| 6,781,577 B2 | 8/2004 | Shigetaka | |
| 6,859,159 B2 | 2/2005 | Michalski | |
| 6,888,538 B2 | 5/2005 | Ely et al. | |
| 6,897,673 B2 * | 5/2005 | Savage et al. | 324/765 |
| 6,970,120 B1 | 11/2005 | Bjornsen | |
| 7,006,078 B2 | 2/2006 | Kim | |
| 7,068,039 B2 | 6/2006 | Parker | |
| 7,075,316 B2 | 7/2006 | Umeda et al. | |
| 7,148,704 B2 | 12/2006 | Philipp | |
| 7,262,609 B2 | 8/2007 | Reynolds | |
| 7,288,946 B2 | 10/2007 | Hargreaves et al. | |
| 7,301,350 B2 | 11/2007 | Hargreaves et al. | |
| 7,339,580 B2 | 3/2008 | Westerman et al. | |
| 7,417,411 B2 | 8/2008 | Hoffman et al. | |
| 7,417,441 B2 | 8/2008 | Reynolds | |
| 7,423,437 B2 | 9/2008 | Hargreaves et al. | |
| 7,449,895 B2 | 11/2008 | Ely et al. | |
| 7,450,113 B2 | 11/2008 | Gillespie et al. | |
| 7,453,270 B2 | 11/2008 | Hargreaves et al. | |
| 7,453,279 B2 | 11/2008 | Corbin, Jr. et al. | |
| 7,521,941 B2 | 4/2009 | Ely et al. | |
| 2003/0091220 A1 | 5/2003 | Sato et al. | |
| 2004/0183560 A1 * | 9/2004 | Savage et al. | 324/765 |
| 2005/0031175 A1 | 2/2005 | Hara et al. | |
| 2006/0038793 A1 | 2/2006 | Philipp | |
| 2007/0100566 A1 * | 5/2007 | Coley | 702/64 |
| 2007/0257894 A1 | 11/2007 | Philipp | |
| 2007/0268273 A1 | 11/2007 | Westerman et al. | |
| 2007/0268274 A1 | 11/2007 | Westerman et al. | |
| 2007/0268275 A1 | 11/2007 | Westerman et al. | |
| 2008/0041639 A1 | 2/2008 | Westerman et al. | |
| 2008/0041640 A1 | 2/2008 | Gillespie et al. | |
| 2008/0042986 A1 | 2/2008 | Westerman et al. | |
| 2008/0042987 A1 | 2/2008 | Westerman et al. | |
| 2008/0042988 A1 | 2/2008 | Westerman et al. | |
| 2008/0042989 A1 | 2/2008 | Westerman et al. | |
| 2008/0042994 A1 | 2/2008 | Gillespie et al. | |
| 2008/0048997 A1 | 2/2008 | Gillespie et al. | |
| 2008/0068100 A1 | 3/2008 | Goodnow et al. | |
| 2008/0116904 A1 | 5/2008 | Reynolds | |
| 2008/0128182 A1 | 6/2008 | Westerman et al. | |
| 2008/0278178 A1 | 11/2008 | Philipp | |

OTHER PUBLICATIONS

USPTO Advisory Action for U.S. Appl. No. 11/230,719, filed Nov. 30, 2007; 3 pages.
USPTO Final Rejection for U.S. Appl. No. 11/230,719, filed Sep. 7, 2007; 9 pages.
USPTO Non-Final Rejection for U.S. Appl. No. 11/230,719, filed May 25, 2007; 6 pages.
USPTO Non-Final Rejection for U.S. Appl. No. 11/230,719, filed Jan. 16, 2007; 8 pages.
USPTO Non-Final Rejection for U.S. Appl. No. 11/230,719, filed Aug. 28, 2006; 7 pages.
USPTO Non-Final Rejection for U.S. Appl. No. 11/230,719, filed May 11, 2006; 5 pages.
Dennis Seguine, "Capacitive Switch San," Cypress Application Note AN2233a, Revision B; Apr. 14, 2005; 6 pages.
Seguine, Ryan; "Layout Guidelines for PSoC CapSense," Cypress Semiconductor Corporation, Application Note AN2292; Jul. 22, 2005; 13 pages.

* cited by examiner

CAPACITANCE MEASUREMENT SYSTEMS AND METHODS

FIELD OF THE INVENTION

Embodiments of the present invention generally relate to capacitive sensors, and methods and systems that measure capacitance.

BACKGROUND ART

A capacitive sensor generally includes an electrode or an array of electrodes. When an object such as a finger or stylus is brought within range of an electrode, the capacitance of the electrode is changed by an amount that depends, at least in part, on the distance from the object to the electrode. For example, a set of electrodes may be arranged in parallel to define a sensing region, and the position of an object relative to the sensing region can be determined based on the change in capacitance per electrode induced by the object. In simple terms, a profile of capacitance versus electrode can be used to unambiguously determine the position of an object in, for example, the x-direction—the x-coordinate corresponds to the peak of the profile. A second set of parallel electrodes arrayed perpendicular to the first set can be similarly used to determine the position of the object in the y-direction. A single electrode can be used to determine proximity (the z-direction).

Accurate measurements of capacitance changes induced by an object are needed so that the position of the object can be accurately determined. Accurate measurements of the background capacitance (e.g., the amount of capacitance that is present even if an object is not in proximity) are also needed to account for noise that may be introduced by changes in ambient temperature or the presence of contaminants on the surface of the sensor, for example.

SUMMARY OF THE INVENTION

Capacitive sensors should be noise resistant and should be able to achieve high resolution. Embodiments in accordance with the present invention provide these and other advantages.

In one embodiment, a current source charges a first capacitor (e.g., a sensor capacitor) and a second capacitor (e.g., an internal capacitor) until voltages at the capacitors equilibrate at a settling voltage. In another embodiment, a third capacitor (e.g., a modification or external capacitor) is also charged until the voltages at each capacitor equilibrate at the settling voltage. In one embodiment, the first capacitor is alternately switched between the current source and ground until the settling voltage is reached. Sensitivity is proportional to signal-to-noise ratio (SNR). Switching of the first (e.g., sensor) capacitor reduces the outside noise sources on that capacitor that could inadvertently couple into the system.

When the settling voltage is reached, the first (sensor) capacitor is disconnected from the current source. The first capacitor can be switched to ground and disconnected from the second capacitor and optional third capacitor, so no coupled noise from the sensor affects the settled voltage. The current source will continue to charge the second capacitor until voltage at the second capacitor reaches a reference voltage (the third capacitor, if used, is similarly charged). The amount of time it takes for the settling voltage to reach the reference voltage corresponds to a measure of capacitance on the first capacitor. In one embodiment, a counter counts the number of cycles generated by an oscillator as the voltage increases from the settling voltage to the reference voltage.

In one embodiment, a comparator is used to compare the voltage at the capacitor(s) to the reference voltage. In one such embodiment, a low pass filter is coupled between the capacitor(s) and the comparator to reduce the effect of high frequency noise. In another such embodiment, the voltage is increased using a single slope analog-to-digital converter (ADC) that includes the current source, the counter and the comparator. The current source can be calibrated so that the settling voltage is just below the reference voltage, so that the count of oscillator cycles will have a larger dynamic range, increasing resolution.

In summary, high sensitivity and high resolution capacitance measurement systems and methods are described. The capacitance on the first capacitor can be accurately measured in the absence of an object to more precisely determine background capacitance. In the presence of an object, the change in capacitance on the first capacitor can be accurately measured, to detect the object with increased sensitivity and/or to more precisely locate the object relative to a sensing region. These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention. Like reference characters are used to denote like items throughout the drawings.

DETAILED DESCRIPTION OF THE INVENTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Figure 1:
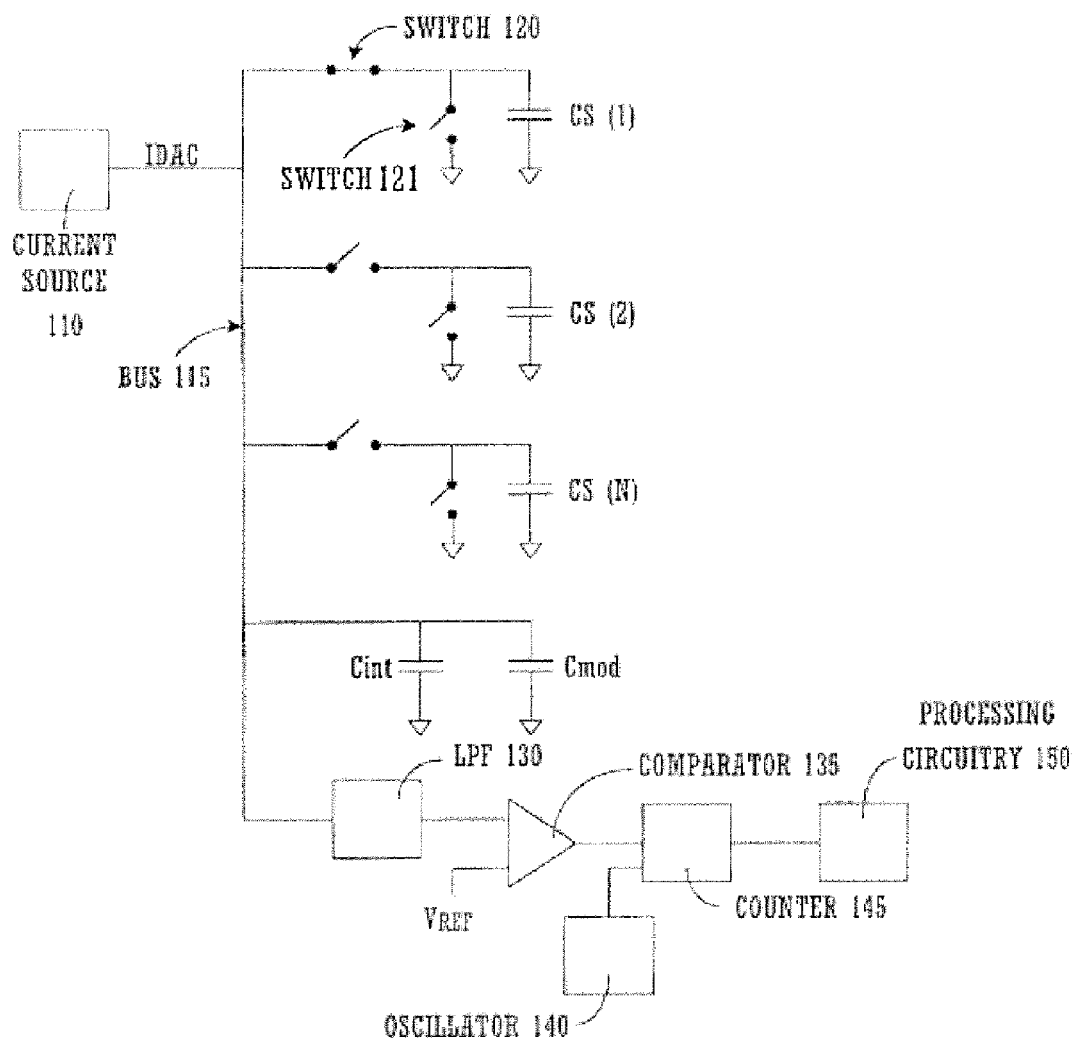
FIG. 1 illustrates one embodiment of a capacitance measuring system, with switches set in one position.

FIG. 1 illustrates one embodiment of a capacitance measuring system 100. In the example of FIG. 1, system 100 includes a number of capacitors Cs(1), Cs(2), ..., Cs(N), which may be referred to as sensor capacitors or sensing capacitors, any one of which may also be referred to herein as a first capacitor. System 100 also includes a capacitor Cint, which may be referred to as a sampling capacitor or internal capacitor and which may also be referred to herein as a second capacitor. In one embodiment, system 100 also includes a capacitor Cmod, which may be referred to as a modification capacitor or external capacitor and which may also be referred to herein as a third capacitor. The capacitor Cint may be internal to a chip, and the capacitor Cmod may be external to the chip. The capacitor Cmod, though optional, can improve noise resistance and hence can increase sensitivity. The capacitor Cmod can also reduce or eliminate large voltage swings within the system.

The system 100 also includes a current source 110. In one embodiment, current source 110 is an adjustable, digital current source that, once adjusted, supplies a constant charging current iDAC. The current source 110 is connected to the capacitors Cint and Cmod by a bus 115. In one embodiment, the bus 115 is an analog bus.

System 100 also includes switching circuitry that includes a number of switches such as switches 120 and 121. The current source 110 can be connected to the capacitors Cs(1), Cs(2), ..., Cs(N), depending on the position of an intervening switch such as switch 120. The capacitors Cs(1), Cs(2), ..., Cs(N) can also be connected to ground, depending on the position of an intervening switch such as switch 121. If, for example, capacitor Cs(1) is connected to ground by closing switch 121, then switch 120 is opened so that capacitor Cs(1) is disconnected from the current source 110 (see FIG. 2). Conversely, if capacitor Cs(1) is connected to current source 110 by closing switch 120, then switch 121 is opened.

In the example of FIG. 1, system 100 also includes an optional low pass filter (LPF) 130, a comparator 135, an oscillator 140, a counter (or timer) 145, and processing circuitry 150 (e.g., a microprocessor). The low pass filter 130, if present, helps to prevent the input of high frequency noise to the comparator 135.

In operation, system 100 measures the capacitance on each of the sensor capacitors Cs(1), Cs(2), ..., Cs(N). In the example of FIG. 1, capacitance is measured on one sensor capacitor at a time. In general, the capacitance on a selected capacitor (e.g., Cs(1)) is translated into an effective resistance by switching the capacitor Cs(1) between the bus 115 and ground (effective resistance is sometimes referred to as a capacitive reactance, measured in ohms). Switching of the capacitor Cs(1) reduces the outside noise sources on that capacitor that could inadvertently couple into the system 100. The current source 110 is used to create a voltage drop across the effective resistance. The voltage drop is sampled using the sampling capacitor Cint and measured using the current source 110, oscillator 140 and counter 145.

More specifically, in the first stage of operation, the selected capacitor (e.g., Cs(1)) is connected to bus 115 and current source 110 by closing switch 120 (switch 121 is open). Charge flows into the capacitors Cs(1), Cint and Cmod from the current source 110. During the first stage, the capacitor Cs(1) is alternately switched between the bus 115 and ground by appropriately opening and closing the switches 120 and 121, until the settling voltage is reached. Each time the capacitor Cs(1) is switched between bus 115 and ground, an amount of charge is removed from the parallel capacitors Cint and Cmod. Charge from the capacitors Cint and Cmod can be transferred to Cs(1) until the voltage—referred to herein as the settling voltage—is the same at each of these capacitors.

In one embodiment, the capacitors Cint and Cmod are precharged to a preset voltage (e.g., the comparator 135 reference voltage Vref) using a voltage source (not shown). By starting at a preset voltage, the time needed to reach the settling voltage can be reduced.

As mentioned above, each time the capacitor Cs(1) is switched between bus 115 and ground, an amount of charge $Q_{sensor}$ is removed from the parallel capacitors Cint and Cmod:

$$Q_{sensor} = C_{sensor} V.$$

Over time, this charge movement acts like a current:

$$Q_{sensor}/t = C_{sensor} V/t.$$

The amount of current depends on the capacitance of sensor Cs(1) ($C_{sensor}$), the switching frequency f (the frequency at which the sensor capacitor Cs(1) is switched between bus 115 and ground), and the voltage:

$$I_{sensor} = f C_{sensor} V.$$

Solving for voltage:

$$V = \frac{I_{sensor}}{f C_{sensor}}.$$

The capacitance on Cs(1) can be thought of as a resistor based on Ohm's Law, resulting in an effective resistance of:

$$R = 1/(f C_{sensor}).$$

The constant charging current iDAC flows through this effective resistance. The voltage across the effective resistance is the resulting voltage on the capacitors Cint and Cmod:

$$V = \frac{1}{f C_{sensor}} (iDAC). \qquad (1)$$

Thus, the switching circuitry (e.g., switches 120 and 121) acts as a capacitance-to-voltage converter. Eventually, the charge will distribute (equilibrate) across the capacitors Cs(1), Cint and Cmod until the voltage is the same at each capacitor. The settling voltage is given by equation (1) and is based on the switching frequency f, the capacitance $C_{sensor}$ of Cs(1), and the amount of current iDAC. The capacitors Cint and Cmod act in effect as bypass capacitors that stabilize the resulting voltage.

Once the voltage settles to the settling voltage, the capacitor Cs(1) can be disconnected from current source 110. In addition, the capacitor Cs(1) can be switched to ground and disconnected from the capacitors Cint and Cmod (switch 121 is closed and switch 120 is opened; refer to FIG. 2), so that no coupled noise from the sensor affects the settled voltage. The settling voltage is held on the capacitors Cint and Cmod. The capacitor Cs(1) may remain connected to the capacitors Cint and Cmod, but better noise immunity is provided if it is disconnected.

Capacitance is measured in the second stage of operation. Once the capacitor Cs(1) is disconnected from current source 110 at the end of the first stage, the capacitors Cint and Cmod are charged by current source 110 until the voltage on those capacitors increases from the settling voltage to the threshold voltage (reference voltage Vref) of comparator 135. The amount of current supplied by the current source 110 in the second stage may be different from that of the first stage. A counter 145 counts the number of oscillator 140 cycles until the voltage reaches the reference voltage. The number of counts is related to the size of the capacitance Cint and Cmod:

$$\frac{\Delta V}{t} = \frac{iDAC}{C_{int} + C_{mod}}.$$

Solving for t:

$$t = \frac{(C_{int} + C_{mod})\Delta V}{iDAC}.$$

The above equation can be transformed to counts:

$$\text{Counts} = \frac{(C_{int} + C_{mod})\Delta V}{iDAC} f_O;$$

where $f_o$ is the clock or cycle frequency of the oscillator 140 (which may be different from the frequency f of equation (1) above).

The number of counts corresponds to the amount of capacitance on the capacitors Cint and Cmod, and therefore also corresponds to the amount of capacitance that was on the sensor capacitor Cs(1) (before it was switched to ground at the end of the first stage). The number of counts increases when the sensor capacitance increases.

The first and second stages described above can be repeated to measure the capacitance on each of the other sensor capacitors Cs(2), . . . , Cs(N), and then repeated again starting with sensor capacitor Cs(1). Between measurement sequences, the current source 110 can be turned off, allowing the voltage on the capacitors Cint and Cmod to decrease; in one embodiment, the voltage decreases to the comparator reference voltage Vref. At the start of the next measurement sequence, the voltage will again be set to the settling voltage, as described above.

Capacitance measuring system 100 can be used as part of an interface (e.g., a touchpad or touchscreen) in an electronic device such as, but not limited to, a computing device (e.g., desktop, laptop, notebook), a handheld device (e.g., cell phone, smart phone, music player, game player, camera), or a peripheral device (e.g., keyboard). Capacitance measuring system 100 can be incorporated as part of a sensing system that can be used, for example, to determine whether or not an object (e.g., a user's finger, a probe, a stylus, etc.) is near or in contact with a sensing region. The sensor electrodes (specifically, the traces connecting the sensor capacitors to the rest of the system) may be made of any conductive material, including substantially transparent materials such as indium tin oxide (ITO).

The capacitance measuring systems described herein can also be used to detect the presence of moisture, contaminants or the like on the surface of a sensing region. In general, capacitance measuring system 100 can be used to detect an element (e.g., an object or a substance) that is proximate to a sensing region. An element in contact with the sensing region is also proximate to that region, and locating the position of an element within the sensing region also includes detecting the element.

The presence of, for example, a finger in proximity to or in contact with the sensor capacitor Cs(1) will increase the capacitance on that sensor which, as shown by equation (1) above, will decrease the effective resistance of that capacitor. The lower effective resistance results in a lower settling voltage across the capacitors Cint and Cmod. Thus, it will take longer for the current source 110 to increase the voltage from the settling voltage to the reference voltage Vref, resulting in more counts relative to the number of counts that would be recorded in the absence of a finger.

Figure 2:
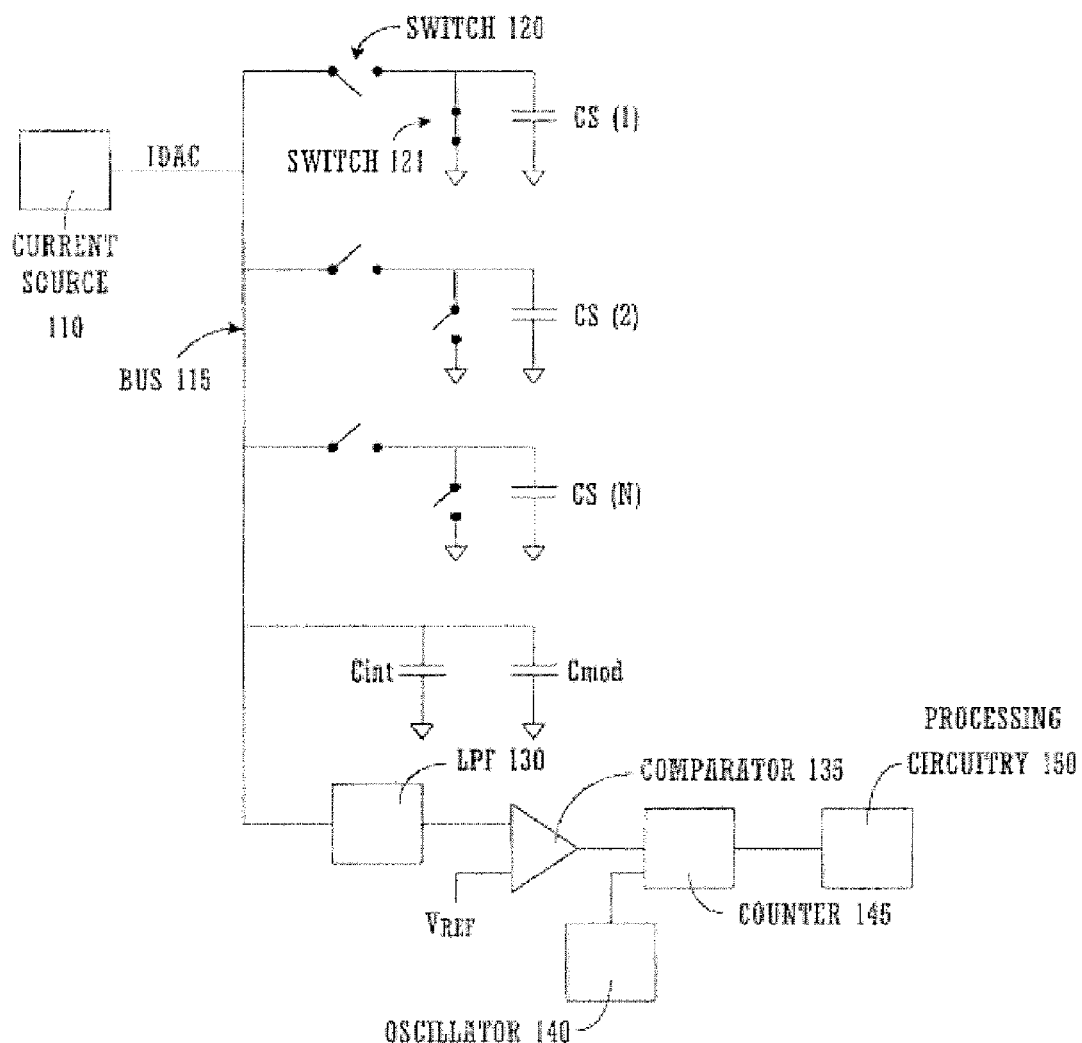
FIG. 2 illustrates one embodiment of a capacitance measuring system, with switches set in another position.
Figure 3:
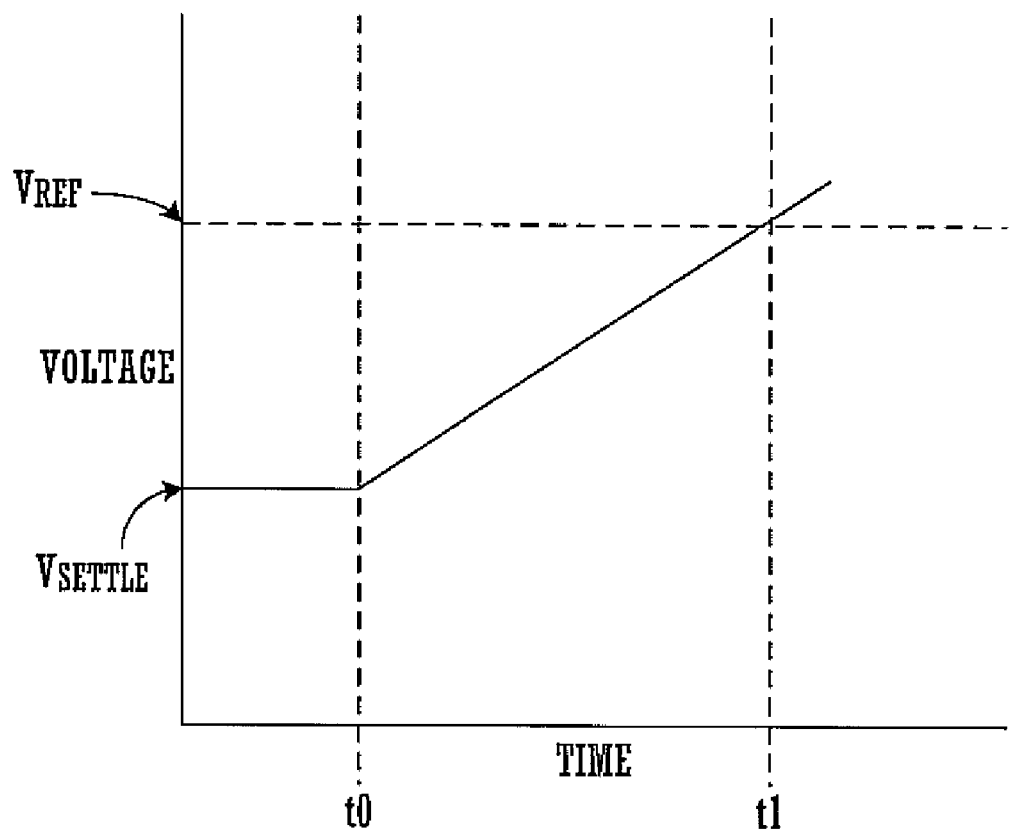
FIG. 3 illustrates voltage versus time in the presence of an object, as measured in a capacitance measuring system according to an embodiment of the present invention.

FIG. 3 illustrates voltage versus time in the presence of an object, as measured in capacitance measuring system 100 (FIG. 2) according to an embodiment of the present invention. Time t0 corresponds to the beginning of the second stage of operation mentioned above, and so the voltage held on the capacitors Cint and Cmod (and also on the bus 115) is the settling voltage. In the embodiment of FIG. 2, the voltage on the capacitors Cint and Cmod (and on the bus 115) is increased using a single slope ADC that includes the current source 110, the counter 145 and the comparator 135. Other types of ADCs (e.g., a multi-slope ADC) can be used instead of a single slope ADC. At time t1, the voltage reaches the threshold voltage (Vref) on the comparator 135. In the example of FIG. 2, the counter counts the number of cycles generated by oscillator 140 between time t0 and time t1.

Figure 4:
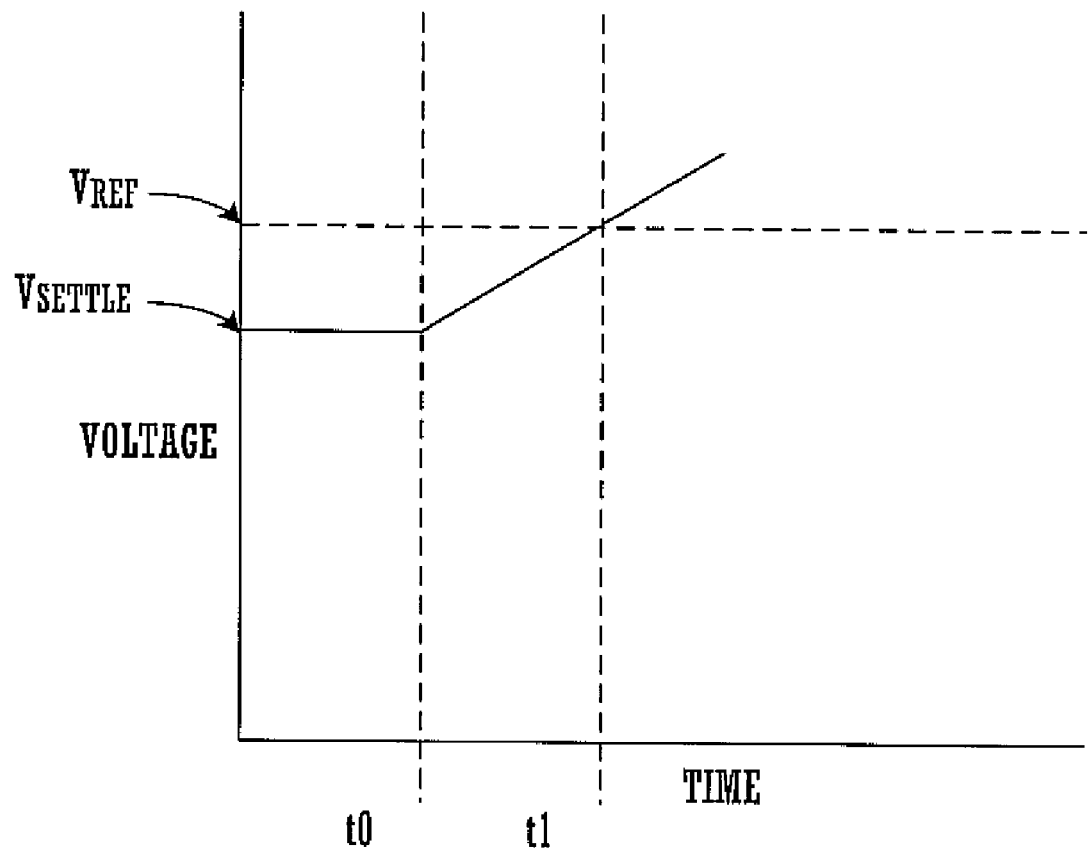
FIG. 4 illustrates voltage versus time in the absence of an object, as measured in a capacitance measuring system according to an embodiment of the present invention.

FIG. 4 illustrates voltage versus time in the absence of an object, as measured in a capacitance measuring system 100 (FIG. 2) according to an embodiment of the present invention. Relative to FIG. 3, the settling voltage is higher in the absence of an object. The voltage increases from the settling voltage to the threshold voltage at the same rate as in FIG. 3 but reaches the threshold voltage faster, resulting in fewer counts between time t0 and time t1 relative to FIG. 3.

To provide consistent sensitivity, the settling voltage is calibrated. The amount of current iDAC during the first operating stage (when the sensor capacitor is alternately switched between ground and the current source 110) determines the settling voltage. In one embodiment, at startup of the system 100 (in the absence of an object), a successive approximation technique is used to find a current iDAC that results in a settling voltage that is just below the threshold voltage Vref.

For example, the current source 110 may be controlled by an eight-bit signal. In successive approximation, the most significant bit is set and the resultant settling voltage is compared to the threshold voltage. Depending on the result of the comparison, the most significant bit either remains set or is cleared, and the next most significant bit is set. This process is repeated to determine the current iDAC that results in a settling voltage that is just below the threshold voltage Vref. As can be deduced from FIGS. 3 and 4, the dynamic range of the counts with an object present versus not present is greater as a result.

As mentioned above, the amount of current provided by current source 110 during the first stage of operation (during which the capacitors Cs(1), Cint and Cmod settle to the settling voltage) and during the second stage of operation (when the voltage on the capacitors Cint and Cmod is increased from the settling voltage to the threshold voltage) can be the same or different.

With reference again to FIG. 2, processing circuitry 150 can determine the presence of an object near a sensor capacitor Cs(1), Cs(2), . . . , Cs(N) by comparing the most recent count for a capacitor to either the count recorded for that capacitor from the preceding measurement sequence or a stored baseline value. The object will be closest to the sensor capacitor that experiences the highest count. Movement of an object relative to the sensor capacitors can be detected by monitoring the count per sensor capacitor over time.

The stored baseline value will account for the presence of contaminants, for example, that may have accumulated on the surface of the sensor surface (e.g., on the surface of a touchpad). In general, the stored baseline value can account for effects that may affect the performance (accuracy) of system 100. The stored baseline value can be updated over time.

Figure 5:
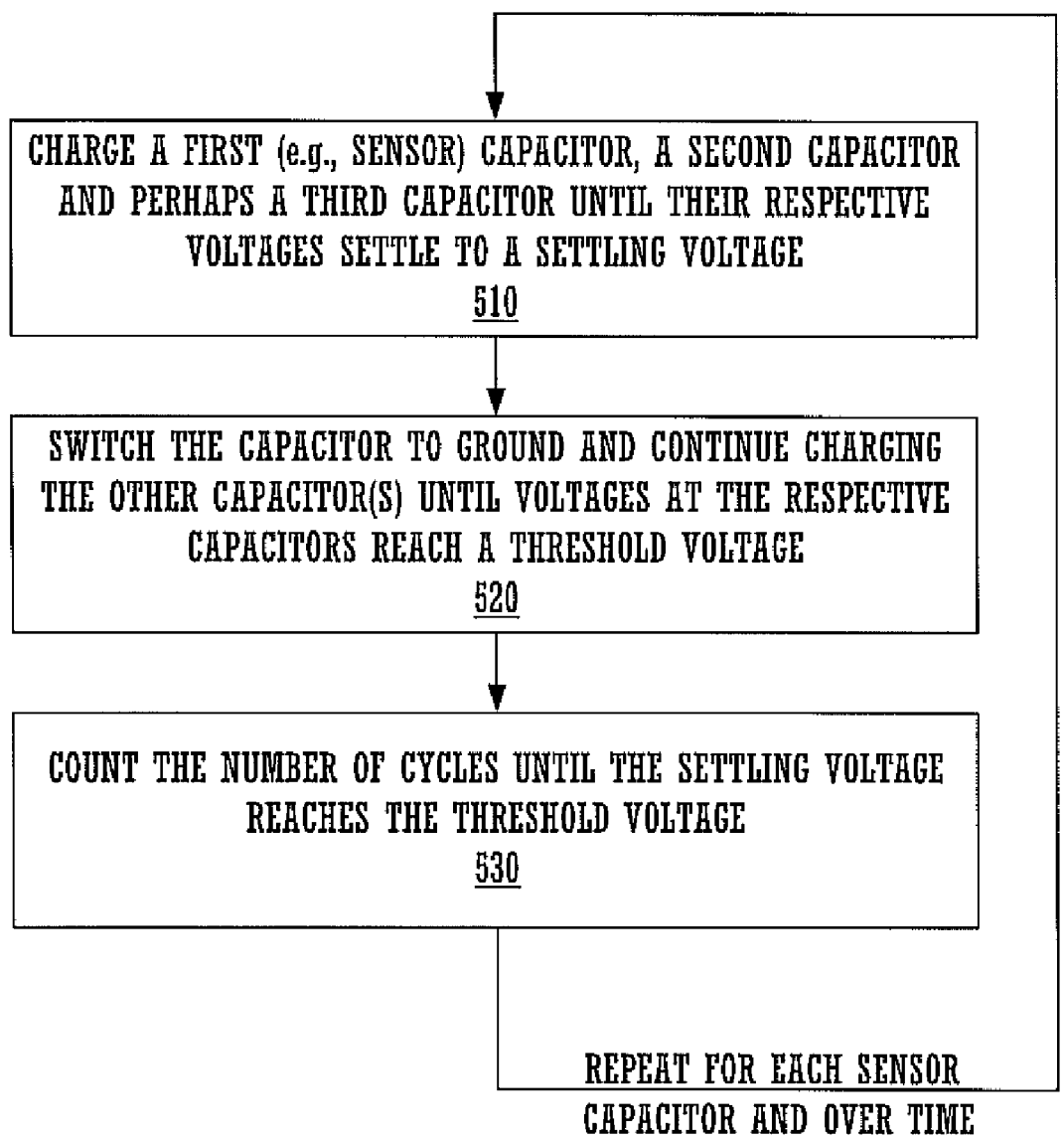
FIG. 5 is a flowchart of one embodiment of a method for measuring capacitance according to the present invention.

FIG. 5 is a flowchart 500 of one embodiment of a method for measuring capacitance according to the present invention. Although specific steps are disclosed in flowchart 500, such steps are exemplary. That is, embodiments of the present invention are well-suited to performing various other steps or variations of the steps recited in flowchart 500. The steps in flowchart 500 may be performed in an order different than presented and that the steps in flowchart 500 are not necessarily performed in the sequence illustrated. Furthermore, the features of the various embodiments described above can be used alone or in combination.

In block 510, with reference also to FIG. 1, a current source charges a first capacitor (e.g., sensor capacitor Cs(1)) and a second capacitor (e.g., capacitor Cint) until their respective voltages equilibrate at a settling voltage. In one embodiment, the first capacitor is switched back and forth between the current source and ground until the settling voltage is reached. In actuality, due to the switching of the first capacitor, there is charging by the current source and discharging from the first capacitor, but the net effect is charging. In one embodiment, the current source also charges a third capacitor (e.g., capacitor Cmod) until the voltages at each capacitor equilibrate at the settling voltage.

In block 520, when the settling voltage is reached, the first capacitor (Cs(1)) is disconnected from the current source. In one embodiment, the first capacitor (Cs(1)) is also switched to ground and disconnected from the capacitors Cint and Cmod. The current source continues to charge the second capacitor (Cint) and the optional third capacitor (Cmod) until voltages at the respective capacitors reach a reference voltage that is greater than the settling voltage.

In block 530, in one embodiment, oscillatory cycles are counted until the settling voltage reaches the reference voltage. In general, the amount of time it takes for the settling voltage reaches the reference voltage is determined.

Blocks 510, 520 and 530 can be repeated for each sensor capacitor Cs(1), Cs(2), . . . , Cs(N). The count per sensor capacitor can be compared across the sensors to determine the position of an object, and the count per sensor can be compared to a preceding count to detect the presence of an object (or to determine that a previously detected object is no longer present).

In summary, high sensitivity and high resolution capacitance measurement systems and methods are described. Capacitance can be accurately measured to detect the presence of an object and/or to determine its relative position. Background capacitance can also be accurately measured to account for factors such as contaminants and ambient temperature.

Embodiments of the present invention are thus described. While the present invention has been described in particular embodiments, it should be appreciated that the present invention should not be construed as limited by such embodiments, but rather construed according to the below claims.

What is claimed is:

1. A system for measuring capacitance, said system comprising:

an adjustable current source supplying a substantially constant current that charges a first capacitor and a second capacitor until voltage at said second capacitor settles to a settling voltage, wherein during said charging said first capacitor is alternately switched between said current source and ground, and wherein said first capacitor is electrically coupled to said second capacitor when switched to said current source, and wherein said first capacitor is electrically disconnected from said second capacitor when switched to ground, and wherein charging of said first capacitor is halted after said settling voltage is reached;

a comparator coupled to said second capacitor that compares voltage at said second capacitor to a reference voltage, wherein after charging of said first capacitor is halted, said current source continues to charge said second capacitor until voltage at said second capacitor reaches said reference voltage; and a counter coupled to said comparator that determines an amount of time until voltage at said second capacitor reaches said reference voltage, wherein said amount of time corresponds to an amount of capacitance on said first capacitor.

2. The system of claim 1 wherein said current source also charges a third capacitor until voltages at said second and third capacitors settle to said settling voltage, wherein said second and third capacitors are coupled in parallel and wherein, after said voltages settle to said settling voltage and charging of said first capacitor is halted, said current source also continues to charge said third capacitor until voltage at said third capacitor reaches said reference voltage.

3. The system of claim 1 wherein said adjustable current source comprises a digitally controlled current source that supplies a constant charging current to said first and second capacitors.

4. The system of claim 1 wherein, after said settling voltage is reached, said first capacitor is switched to ground and disconnected from said second capacitor.

5. The system of claim 1 wherein said counter counts a first number of oscillatory cycles until voltage at said second capacitor reaches said reference voltage, wherein first number corresponds to a value of capacitance of said first capacitor.

6. The system of claim 5 wherein, after voltage at said second capacitor reaches said threshold voltage, then charging of said second capacitor is halted until a next sequence is begun, wherein during said next sequence said current source again charges said first and second capacitors until voltage at said second capacitor settles to said settling voltage, wherein again charging of said first capacitor is halted while said current source continues to charge said second capacitor until voltage at said second capacitor reaches said reference voltage, and wherein said counter counts a second number of oscillatory cycles until voltage at said second capacitor reaches said reference voltage.

7. The system of claim 6 further comprising processing circuitry coupled to said counter that compares said first and second numbers to identify a change in capacitance of said first capacitor.

8. The system of claim 1 wherein said first capacitor is one of a plurality of capacitors coupled to said current source, wherein said system determines a measure of capacitance for each capacitor of said plurality of capacitors.

9. The system of claim 8 further comprising processing circuitry coupled to said counter that uses measures of capacitance for said plurality of capacitors to detect an element within a sensing range of at least one of said capacitors.

10. The system of claim 1 further comprising a low pass filter coupled to said comparator.

11. A method of measuring capacitance, said method comprising:
- charging, by an adjustable current source supplying a constant current, a first capacitor and a second capacitor until voltage at said second capacitor settles to a settling voltage, wherein during said charging said first capacitor is switched back and forth between said current source and ground;
- when said settling voltage is reached, halting charging of said first capacitor while continuing to charge said second capacitor, by said adjustable current source, until voltage at said second capacitor reaches a reference voltage that is greater than said settling voltage; and
- determining a measure of time for voltage at said second capacitor to reach said reference voltage, wherein said determining comprises counting a first number of oscillatory cycles, said counting starting at the time charging of the first capacitor is halted, until said voltage at said second capacitor reaches said reference voltage, wherein said first number corresponds to said measure of capacitance on said first capacitor.

12. The method of claim 11 further comprising:
- charging a third capacitor until voltages at said second and third capacitors settle to said settling voltage; and
- after said settling voltage is reached and said charging of said first capacitor is halted, continue charging said third capacitor until voltage at said third capacitor reaches said reference voltage.

13. The method of claim 11 wherein said charging further comprises supplying a constant charging current to said first and second capacitors using a digital current source.

14. The method of claim 11 further comprising:
- after voltage at said second capacitor reaches said threshold voltage, halting charging of said second capacitor and reducing voltage at said second capacitor to less than said threshold voltage;
- again charging said first and second capacitors until voltage at said second capacitor settles to said settling voltage;
- when said settling voltage is again reached, halting charging of said first capacitor while continuing to charge said second capacitor until voltage at said second capacitor again reaches said reference voltage; and
- counting a second number of oscillatory cycles, said counting starting at the time charging of the first capacitor is halted, until voltage at said second capacitor reaches said reference voltage.

15. The method of claim 14 further comprising comparing said first and second numbers to identify a change in said measure of capacitance of said first capacitor.

16. The method of claim 11 wherein said first capacitor is one of a plurality of capacitors, wherein said method further comprises measuring capacitance for each capacitor of said plurality of capacitors.

17. The method of claim 16 further comprising detecting an element in sensing range of at least one of said capacitors based on capacitances measured for said plurality of capacitors.

18. The method of claim 11 further comprising switching said first capacitor to ground and disconnecting said first capacitor from said second capacitor after said settling voltage is reached.

19. A system for measuring capacitance, said system comprising:
- a first capacitor coupled to an adjustable current source supplying a constant current;
- a second capacitor coupled to said current source in parallel to said first capacitor;
- switching circuitry for controlling charging of said first capacitor and said second capacitor, wherein in a first operating stage both said first capacitor and said second capacitor are charged by said current source until voltages at said second capacitor and said first capacitor equilibrate at a settling voltage, and wherein in a second operating stage said second capacitor but not said first capacitor is charged by said current source until voltage at said second capacitor increases to a reference voltage, and wherein further said switching circuitry alternately switches said first capacitor between said current source and ground during said first operating stage; and
- processing circuitry coupled to said second capacitor for determining a measure of capacitance on said first capacitor based on how long it takes for voltage at said second capacitor to increase from said settling voltage to said reference voltage.

20. The system of claim 19 further comprising a third capacitor coupled to said current source in parallel to said second capacitor, wherein said third capacitor is charged by said current source in both said first and second operating stages.

21. The system of claim 19 wherein said current source comprises a digital current source that supplies a constant charging current.

22. The system of claim 19 wherein said first and second operating stages are repeatable, wherein said processing circuitry is operable for determining said measure of capacitance of said first capacitor over time.

23. The system of claim 19 wherein said first capacitor is one of a plurality of first capacitors coupled to said adjustable current source, wherein said system determines a measure of capacitance for each first capacitor of said plurality of first capacitors.

24. The system of claim 19 further comprising a comparator coupled to said second capacitor that compares voltage at said second capacitor to said reference voltage.

25. The system of claim 19 further comprising:
- a counter coupled to said processing circuitry; and
- an oscillator coupled to said counter, wherein said counter counts a number of oscillator cycles while voltage at said second capacitor increases from said settling voltage to said reference voltage, wherein said number corresponds to a value of capacitance of said first capacitor.

* * * * *